United States Patent [19]

Johnson

[11] Patent Number: 5,488,321
[45] Date of Patent: Jan. 30, 1996

[54] STATIC HIGH SPEED COMPARATOR

[75] Inventor: Mark G. Johnson, Los Altos, Calif.

[73] Assignee: Rambus, Inc., Mountain View, Calif.

[21] Appl. No.: 441,956

[22] Filed: May 16, 1995

Related U.S. Application Data

[63] Continuation of Ser. No. 45,324, Apr. 7, 1993, abandoned.

[51] Int. Cl.⁶ .................. H03K 5/22; H03K 5/08
[52] U.S. Cl. .................. 327/66; 327/67; 327/312; 327/320
[58] Field of Search .................. 327/63, 64, 65, 327/66, 68, 375, 563, 72, 73, 74, 310, 312, 314, 319, 320, 323, 324, 325, 67

[56] References Cited

U.S. PATENT DOCUMENTS

| | | | |
|---|---|---|---|
| 4,110,641 | 8/1978 | Payne | 307/355 |
| 4,249,095 | 2/1981 | Hsu | 307/355 |
| 4,394,587 | 7/1983 | McKenzie | 327/66 |
| 5,077,489 | 12/1991 | Gola | 307/355 |
| 5,223,753 | 6/1993 | Lee | 307/355 |
| 5,289,054 | 2/1994 | Lucas | 327/65 |
| 5,362,995 | 11/1994 | Kubo | 327/65 |

OTHER PUBLICATIONS

Lance A. Glasser et al., *The Design and Analysis of VLSI Circuits*, Chapter 5, Addison–Wesley Publishing Company, Massachusetts, pp. 306–307 (1985).

*Primary Examiner*—William L. Sikes
*Assistant Examiner*—Tlep Nguyen
*Attorney, Agent, or Firm*—Blakely, Sokoloff, Taylor & Zafman

[57] ABSTRACT

A comparator circuit comprising a transconductance stage that senses a first and a second input voltage and a transresistance stage that senses the current output of the transconductance stage while limiting a voltage swing at the output of the transconductance stage. The transresistance stage generates an output voltage at an output node that indicates whether the first or the second input voltage has a greater magnitude.

4 Claims, 7 Drawing Sheets

STATIC HIGH SPEED COMPARATOR

This is a continuation of application Ser. No. 08/045,324, filed Apr. 7, 1993, now abandoned.

FIELD OF THE INVENTION

The present invention pertains to the field of integrated circuit devices. More particularly, this invention relates to a low power consumption high speed static comparator for an integrated circuit.

BACKGROUND OF THE INVENTION

A comparator implemented on an integrated circuit can perform a variety of useful functions. A comparator senses two input voltages and generates an output signal that indicates which of the two input voltages has a greater magnitude. Comparators are commonly employed as sense amplifiers for static random access memories, dynamic random access memories, as well as on-chip cache memories for microprocessors. Comparators are also commonly employed in buffer circuits that couple an integrated circuit to an external system. Also, comparators are critical elements of analog-to-digital converters and digital-to-analog converters.

A static comparator is a comparator that is always enabled. A static comparator is not timed, controlled, or activated by clock signals. A static comparator is constantly comparing two input voltages. Static comparators may be employed in circuits having no clock signal. Static comparators may also be employed when the input voltages to the comparator change unpredictably, or when the input voltages change at times far removed from a clock edge.

A high speed static comparator implemented on an integrated circuit is typically required to have a short propagation delay between the input and the output of the comparator. A high speed static comparator for an integrated circuit should also have high gain and low power consumption. Moreover, a high speed static comparator should detect differences between two input voltages even when the difference between the input voltages is very slight.

The requirements of high gain and low power consumption are interrelated by a gain bandwidth product (GBW). A static comparator implemented on an integrated circuit is typically modeled as a single pole system having a constant gain bandwidth product. If the gain of the comparator is increased, the bandwidth of the comparator must necessarily decrease. Moreover, the propagation delay of a comparator is inversely proportional to the bandwidth of the comparator. Thus, a static comparator having high gain will necessarily have small bandwidth and a large propagation delay between the input and the output.

FIG. 1 illustrates a typical prior static comparator 100 for an integrated circuit. The static comparator 100 is comprised of a differential amplifier and a current mirror load. The differential amplifier is comprised of a pair of NMOS transistors Q1 and Q2. The current mirror load is comprised of a pair of PMOS transistors Q3 and Q4. A bias current generator 16 generates a bias current ($I_{BIAS}$) for the transistors Q1 and Q2.

In an alternative implementation, the transistors Q1 and Q2 are PMOS transistors, and the transistors Q3 and Q4 are NMOS transistors. Also, the static comparator 100 could be implemented with a differential amplifier comprising a pair of NPN bi-polar transistors.

The static comparator 100 senses input voltages at an input node 10 and an input node 12. If the voltage at the input node 10 is greater than the voltage at the input node 12, a current through the transistor Q1 ($I_1$) is greater than a current through the transistor Q2 ($I_2$). The current mirror of the static comparator 100 (transistors Q3 and Q4) forces the current difference ($I_1-I_2$) to an external circuit coupled to an output node 14.

Typically, the output node 14 is coupled to the gates of the input transistors forming a next circuit stage. The input gates of the next circuit stage provide a capacitance load to the static comparator 100. The current supplied by the static comparator 100 at the output node 14 ($I_1-I_2$) charges and discharges the capacitance load provided by the next circuit stage.

The static comparator 100 is slow because a relatively small bias current $I_{BIAS}$ charges and discharges a capacitance load through a relatively large voltage swing at the output node 14. The voltage swing at the output node 14 is relatively large because the static comparator 100 typically has a relatively large gain. The voltage swing at the output node 14 typically varies between a high level substantially equal to the supply voltage VDD, and a low level substantially equal to the voltage at a tail node 18.

The bias current $I_{BIAS}$ is typically limited to relatively low levels to maintain low power consumption for the static comparator 100. The propagation delay ($\Delta t$) for the static comparator is relatively large because the voltage swing at the output node 14 ($\Delta v$) is relatively large. The propagation delay $\Delta t$ is determined by the following equation which governs the charging and discharging of a capacitance load at the output node 14: $I=C \times \Delta v/\Delta t$.

The propagation delay $\Delta t$ of the static comparator 100 can be reduced by increasing the bias current $I_{BIAS}$. However, the increased bias current $I_{BIAS}$ causes a corresponding increase in power consumption of the static comparator 100. Unfortunately, the increased power consumption in a static comparator 100 contributes to overall power consumption in a system. In a typical application, an integrated circuit contains many such static comparators. The excessive power consumption of a single static comparator is multiplied across the integrated circuit, thereby causing unacceptably high power consumption for the system.

SUMMARY AND OBJECTS OF THE INVENTION

One object of the present invention is to implement a high speed static comparator.

Another object of the present invention is to implement a high speed static comparator on an integrated circuit.

Another object of the present invention is to implement a high speed static comparator that minimizes power consumption.

Another object of the present invention is to reduce the power consumption of an integrated circuit that contains one or more static comparators.

A further object of the present invention is to increase the bandwidth of a static comparator implemented on an integrated circuit without increasing the bias currents supplied to the static comparator circuit.

Another object of the present invention is to implement a high speed static comparator having a transconductance stage followed by a transresistance stage, wherein the transresistance stage clamps the voltage swing at the output of the transconductance stage.

A further object of the present invention is to implement a high speed static comparator having a transconductance stage followed by a transresistance stage, wherein the transconductance stage generates a voltage overshoot at the input to the transresistance stage in order to accelerate switching of the transresistance stage.

These and other objects of the invention are provided by a comparator circuit comprising a transconductance stage and a transresistance stage. The transconductance stage senses a first input voltage on a first input node and a second input voltage on a second input node. The transconductance stage generates a first current into a feedback node. The first current indicates whether the first or the second input voltage has a greater magnitude.

The transresistance stage is coupled to the feedback node. The transresistance stage senses the first current while limiting a voltage swing at the feedback node. The transresistance stage generates an output voltage at an output node that indicates whether the first or the second input voltage has a greater magnitude.

Other objects, features and advantages of the present invention will be apparent from the accompanying drawings, and from the detailed description that follows below.

BRIEF DESCRIPTION OF THE DRAWINGS

The present invention is illustrated by way of example and not limitation in the figures of the accompanying drawings in which like references indicate similar elements, and in which.

DETAILED DESCRIPTION

Figure 1:
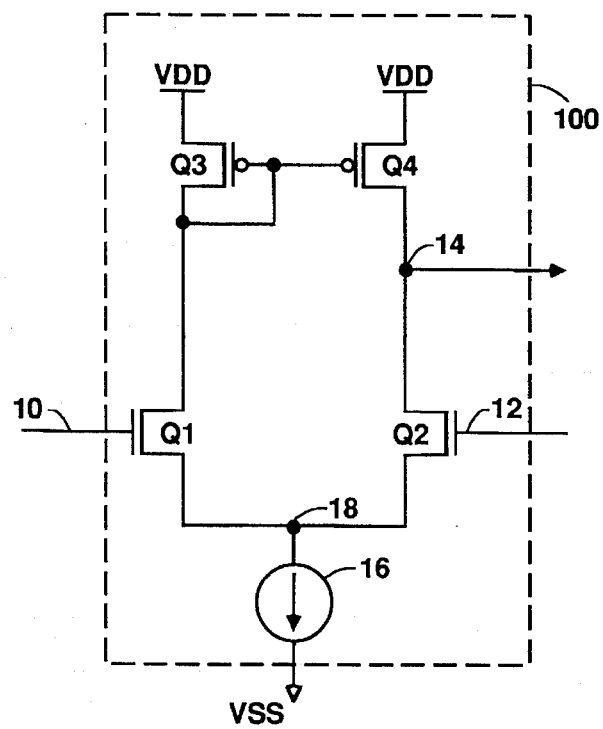
FIG. 1 illustrates a typical prior static comparator for an integrated circuit, wherein the static comparator is comprised of a differential amplifier and a current mirror load.
Figure 2:
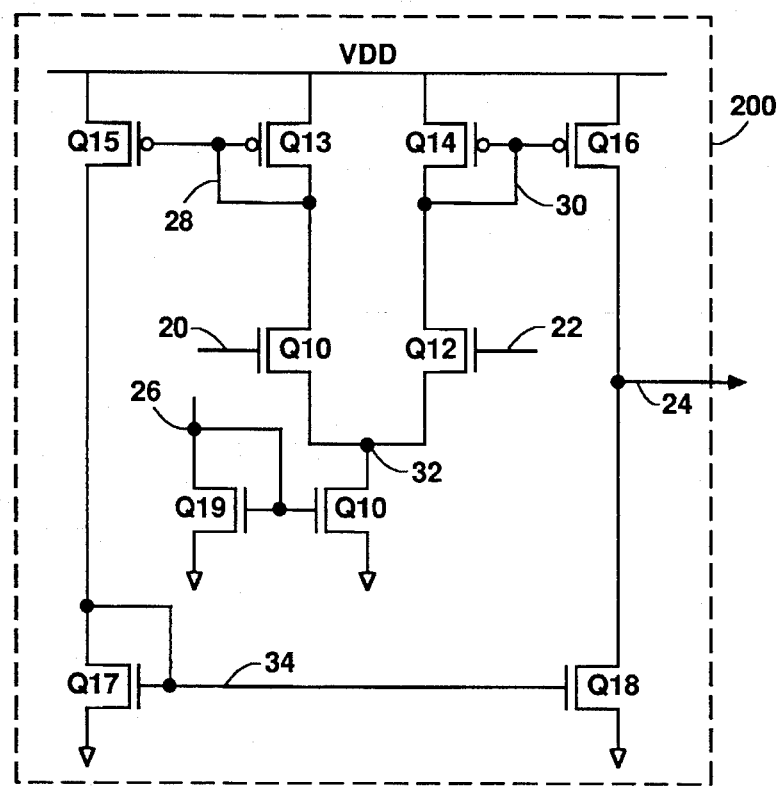
FIG. 2 illustrates a transconductance amplifier that senses input voltages at a pair of input nodes, and that generates an output current at an output node.

FIG. 2 illustrates a transconductance amplifier 200. The transconductance amplifier 200 senses input voltages at an input node 20 and an input node 22. The transconductance amplifier 200 generates an output current at an output node 24.

An NMOS transistor Q10 senses an input voltage at the input node 20 and an NMOS transistor Q12 senses an input voltage at the input node 22. The transistors Q10 and Q12 are configured as a differential input transistor pair.

The transistor Q10 is coupled to a PMOS transistor Q13, and the transistor Q12 is coupled to a PMOS transistor Q14. The transistors Q13 and Q14 are diode load transistors for the differential input pair (transistors Q10 and Q12). The gate and the drain of the transistor Q13 are coupled at a node 28. Similarly, the gate and the drain of the transistor Q14 are coupled at a node 30.

The transistors Q13 and Q14 drive a pair of PMOS transistors Q15 and Q16. The transistors Q15 and Q16 are coupled to a current mirror circuit comprising a pair of NMOS transistors Q17 and Q18.

An external bias current $I_{BIAS}$ is supplied into a node 26. The bias current $I_{BIAS}$ drives a current mirror circuit comprising a pair of NMOS transistors Q19 and Q20.

The gate to source voltage of the transistor Q13 ($V_{GS13}$) is substantially equal to the gate to source voltage of the transistor Q15 ($V_{GS15}$). Also, the gate to source voltage of the transistor Q14 ($V_{GS14}$) is substantially equal to the gate to source voltage of the transistor Q16 ($V_{GS16}$). The transistors Q13 through Q16 are fabricated with substantially similar gate width-to-length ratios. As a consequence, a bias current flowing through the transistors Q15 and Q16 is substantially equal to a bias current flowing through the transistors Q13 and Q14.

The transistors Q15 and Q17 comprise an inverter stage, and the transistors Q16 and Q18 comprise an inverter stage. The two inverter stages yield a maximum common mode range at the output node 24. As described fully below, a subsequent transresistance stage forces the voltage at the output node 24 to approximately VDD/2. The maximum common mode range at the output node 24 yields a relatively large gain for the transconductance amplifier 200 independent of the common mode input voltages at the input nodes 20 and 22.

The transistor Q13 clamps the voltage at the node 28 to a relatively small voltage swing. Similarly, the transistor Q14 clamps the voltage at the node 30 to a relatively small voltage swing, and the transistor Q17 clamps the voltage at the node 34 to a relatively small voltage swing.

However, the voltage at the output node 24 is not clamped. The output node 24 is pulled up by the current source transistor Q16 and pulled down by the current source transistor Q18. As a consequence, the transconductance amplifier 200 generates an output current ($I_{OUT}$) at the output node 24 which yields a transconductance gain function ($I_{OUT}/V_{IN}$).

Figure 3:
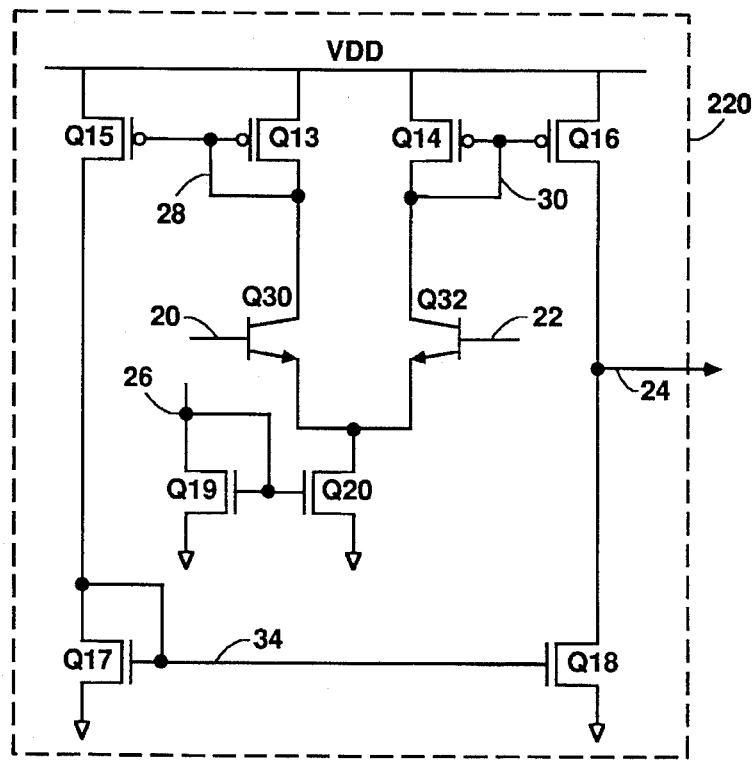
FIG. 3 illustrates a transconductance amplifier that employs a pair of NPN bi-polar transistors to sense input voltages at the input nodes.

FIG. 3 illustrates a transconductance amplifier 220. The transconductance amplifier 220 is similar to the transconductance amplifier 200 apart from the differential input transistors. The transconductance amplifier 220 employs a pair of NPN bi-polar transistors Q30 and Q32 to sense input voltages at the input nodes 20 and 22. The NPN transistors Q30 and Q32 have higher sensitivity than the NMOS transistors Q10 and Q12. As a consequence, the transconductance amplifier 220 responds to smaller input voltage differences when compared with the transconductance amplifier 200.

Figure 4:
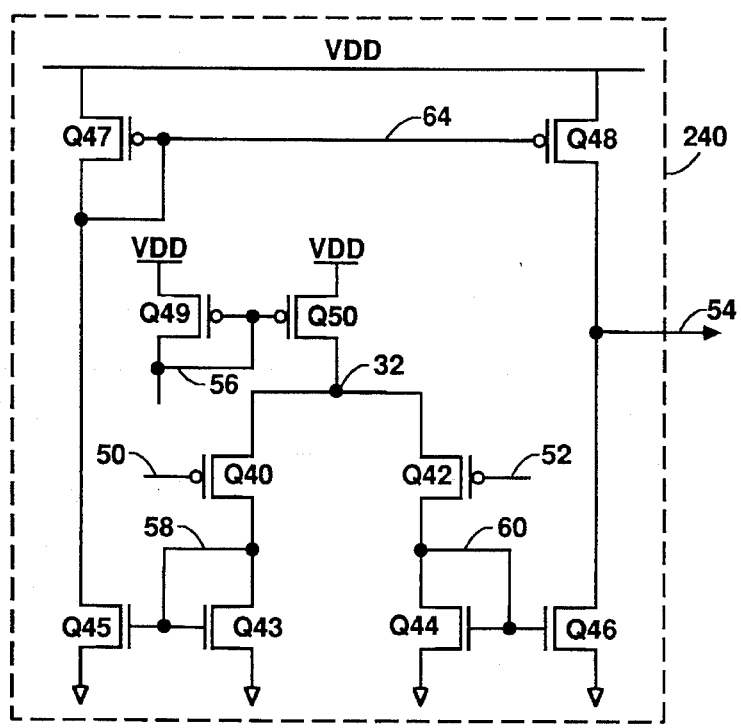
FIG. 4 illustrates a transconductance amplifier that is the complement of the transconductance amplifier of FIG. 2.

FIG. 4 illustrates a transconductance amplifier 240. The transconductance amplifier 240 senses input voltages at an input node 50 and an input node 52, and generates an output current at an output node 54.

A PMOS transistor Q40 senses an input voltage at the input node 50 and a PMOS transistor Q42 senses an input voltage at the input node 52. The transistor Q40 is coupled to an NMOS transistor Q43, and the transistor Q42 is coupled to an NMOS transistor Q44. The transistors Q43 and Q44 are diode load transistors for the differential input pair (transistors Q40 and Q42). The gate and the drain of the transistor Q43 are coupled at a node 58, and the gate and the drain of the transistor Q44 are coupled at a node 60.

The transistors Q43 and Q44 drive a pair of NMOS transistors Q45 and Q46. The transistors Q45 and Q46 are coupled to a current mirror circuit comprising a pair of PMOS transistors Q47 and Q48. An external bias current $I_{BIAS}$ is supplied into a node 56. The bias current $I_{BIAS}$ drives a current mirror circuit comprising a pair of PMOS transistors Q49 and Q50.

The gate to source voltage of the transistor Q43 ($V_{GS43}$) is substantially equal to the gate to source voltage of the transistor Q45 ($V_{GS45}$). Also, the gate to source voltage of the transistor Q44 ($V_{GS44}$) is substantially equal to the gate to source voltage of the transistor Q46 ($V_{GS46}$). The transistors Q43 through Q46 are fabricated with substantially similar gate width-to-length ratios. As a consequence, a bias current flowing through the transistors Q45 and Q46 is substantially equal to a bias current flowing through the transistors Q43 and Q44.

An inverter stage comprising the transistors Q45 and Q47 combined with an inverter stage comprising the transistors Q46 and Q48 yield a maximum common mode range at the output node 54. As described fully below, a subsequent transresistance stage forces the voltage at the output node 54 to approximately VDD/2. The maximum common mode range at the output node 54 yields a relatively large gain for the transconductance amplifier 240 independent of the common mode input voltages at the input nodes 50 and 52.

The transistor Q43 clamps the voltage at the node 58 to a relatively small voltage swing, the transistor Q44 clamps the voltage at the node 60 to a relatively small voltage swing, and the transistor Q47 clamps the voltage at the node 64 to a relatively small voltage swing. The output node 54 is pulled down by the current source transistor Q46 and pulled up by the current source transistor Q48. As a consequence, the transconductance amplifier 240 generates an output current at the output node 54, corresponding to a transconductance gain function.

Figure 5:
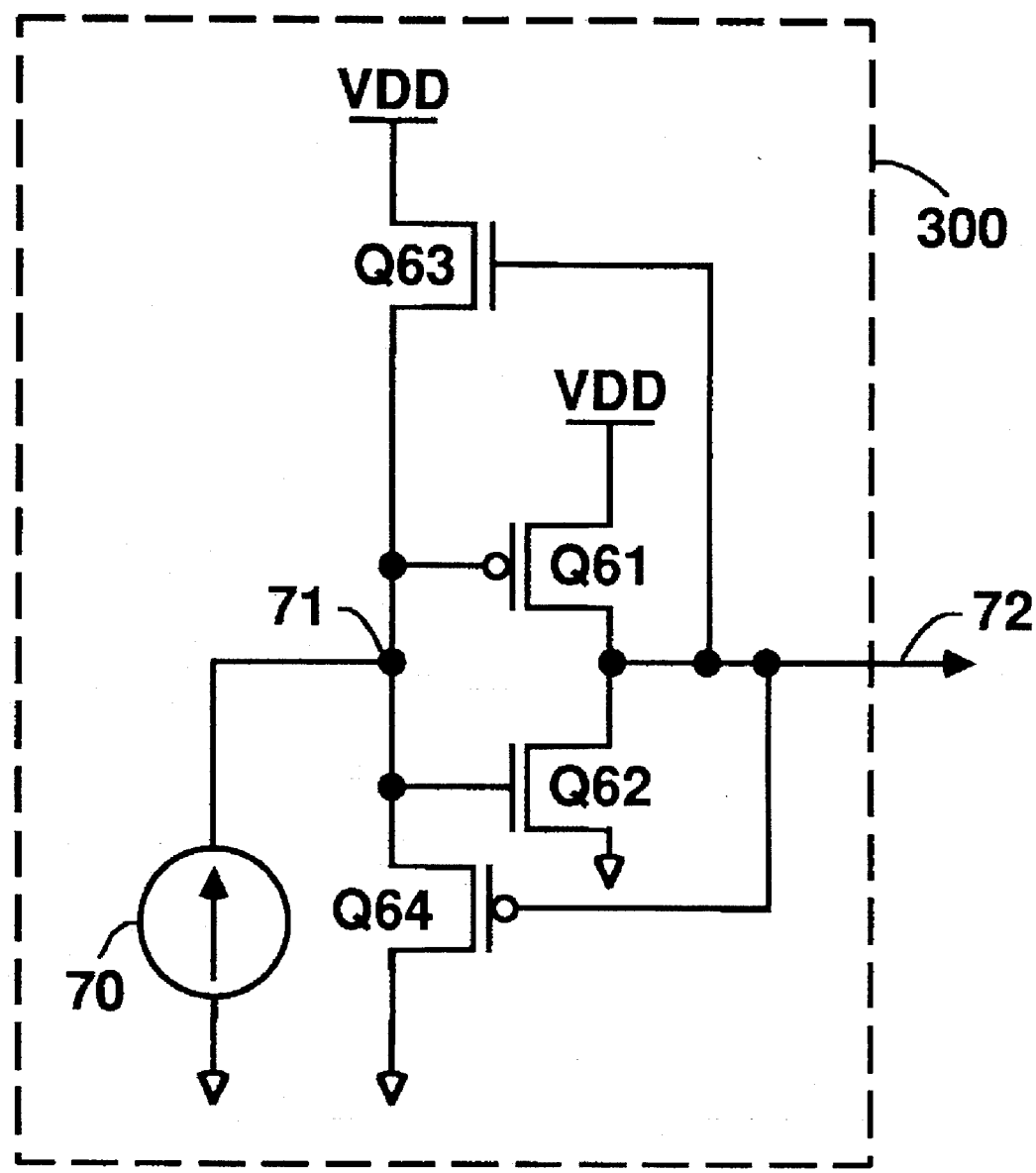
FIG. 5 illustrates a transresistance stage that receives an input current ($I_{IN}$) at a feedback node, and that generates an output voltage ($V_{OUT}$) at an output node.

FIG. 5 illustrates a transresistance stage 300. The transresistance stage 300 receives an input current 70 ($I_{IN}$) and generates an output voltage ($V_{OUT}$) at an output node 72. The gain function for the transresistance stage 300 ($V_{OUT}/I_{IN}$) has the units of resistance.

The transresistance stage 300 is comprised of a CMOS inverter and a pair of source followers. The CMOS inverter is comprised of a PMOS transistor Q61 and an NMOS transistor Q62. The source followers are an NMOS transistor Q63 and a PMOS transistor Q64.

If the input current $I_{IN}$ is positive, the voltage at a feedback node 71 begins to rise. When the voltage at the feedback node 71 reaches the switching threshold of the CMOS inverter (transistors Q61 and Q62), the CMOS inverter drives the output node 72 to a low voltage level. However, the CMOS inverter drives the output node 72 to a low voltage level after an inverter delay. The low voltage level at the output node 72 switches on the transistor Q64. As a consequence, the transistor Q64 sinks the input current $I_{IN}$ and clamps the feedback node 71 from rising to a higher voltage level.

If the input current $I_{IN}$ is negative, the input current $I_{IN}$ discharges the feedback node 71, which causes the voltage at the feedback node 71 to fall to a low voltage level. Moreover, the transistor Q64 discharges the feedback node 71. When the voltage on the node feedback 71 falls to the switching threshold of the CMOS inverter (transistors Q61 and Q62), the CMOS inverter drives the output node 72 to a high voltage level. The CMOS inverter drives the output node 72 to a high voltage level after an inverter delay. When the voltage at the output node 72 switches to a high voltage level, the transistor Q64 switches off and the transistor Q63 switches on. As a consequence, the transistor Q63 sinks the input current $I_{IN}$ and clamps the voltage at the feedback node 71 from falling to a lower voltage level.

The transresistance stage 300 employs negative feedback. When the input current $I_{IN}$ falls, the voltage at the feedback node 71 falls and causes the voltage at the output node 72 to rise, which causes the voltage at the feedback node 71 to rise, thereby counteracting the original input current stimulus. However, the feedback is applied after a delay (corresponding to the CMOS inverter delay) to reduce the phase margin of the transresistance stage 300 and to generate an overshoot at the feedback node 71. The overshoot accelerates the voltage switching at the output node 72.

Figure 6:
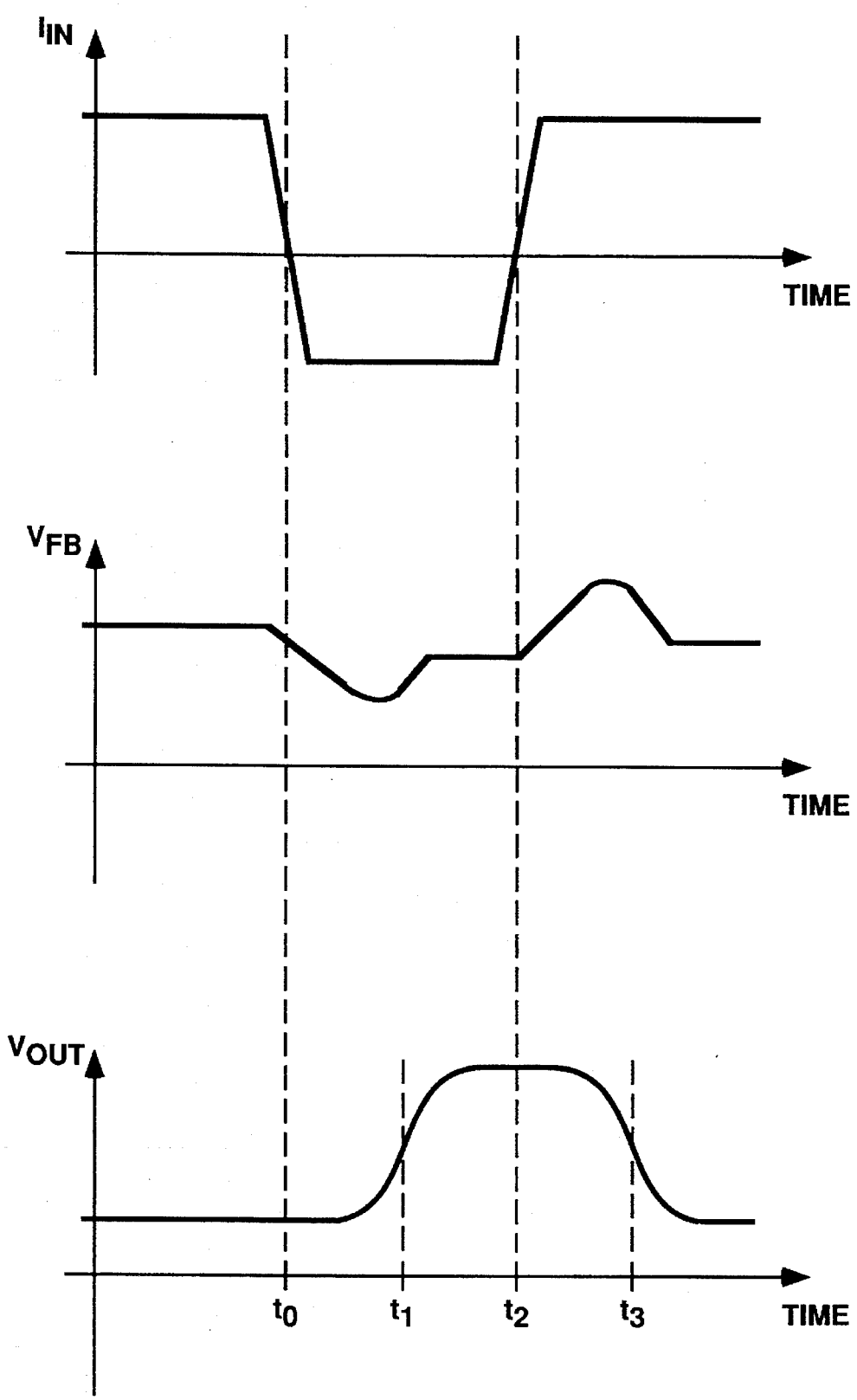
FIG. 6 illustrates the voltage at the feedback node ($V_{FB}$) and the voltage at the output node ($V_{OUT}$) in response to an example input current $I_{IN}$.

FIG. 6 illustrates the voltage at the feedback node 71 ($V_{FB}$) and the voltage at the output node 72 ($V_{OUT}$) in response to an example input current ($I_{IN}$).

Prior to time $t_0$, the transistor Q64 is clamping the feedback node 71. At time $t_0$, the input current $I_{IN}$ switches from positive to negative and the voltage at the feedback node 71 begins discharging. At time $t_1$, the transistor Q64 switches off and the transistor Q63 switches on. The transistor Q63 sinks the negative input current $I_{IN}$ and clamps the voltage at the feedback node 71 from falling to a lower voltage level.

At time $t_2$, the input current $I_{IN}$ switches from negative to positive and charges the feedback node 71. At time $t_3$, the transistor Q63 switches off and the transistor Q64 switches on. The transistor Q64 sinks the positive input current $I_{IN}$ and clamps the voltage at the feedback node 71 from rising to a higher voltage level.

The time interval between $t_0$ and $t_1$, and the time interval between $t_2$ and $t_3$ corresponds to the delay of the CMOS inverter (transistors Q61 and Q62).

During the switching interval of the input current $I_{IN}$, the feedback node 71 is driven by the sum of the input current $I_{IN}$ and a current from either the transistor Q63 or the transistor Q64. After the delay of the CMOS inverter (transistors Q61 and Q62), the feedback node 71 is clamped when one of the source followers (either the transistor Q63 or the transistor Q64) switches off while the other source follower switches on.

The voltage excursions at the feedback node 71 are relatively small because the feedback node 71 is clamped. The CMOS inverter (transistors Q61 and Q62) switches relatively quickly because the feedback node 71 is clamped at the switching threshold of the CMOS inverter. The voltage overshoot at the feedback node 71 causes the CMOS inverter to switch even faster.

Figure 7:
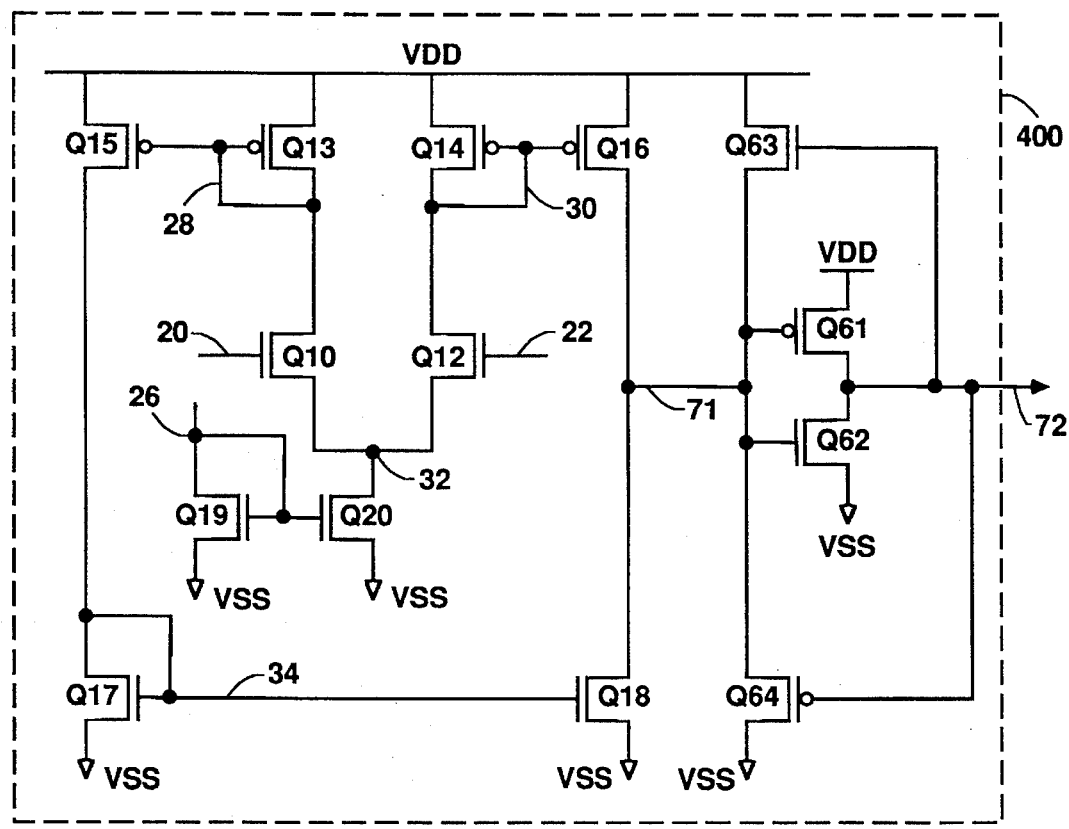
FIG. 7 illustrates a high speed static comparator comprising a transconductance amplifier coupled to a transresistance stage.

FIG. 7 illustrates a high speed static comparator 400. The high speed static comparator 400 comprises a transconductance amplifier coupled to a transresistance stage. The transconductance amplifier senses input voltages at the input node 20 and the input node 22, an generates a current at the feedback node 71 into the transresistance stage. The transresistance stage senses the current into the feedback node 71, and generates an output voltage at the output node 72. The output voltage at the output node 72 indicates which of the input voltages at the input nodes 20 and 22 has a greater magnitude.

The voltage generated by the transconductance amplifier at the feedback node 71 is clamped by the transresistance stage. The combination of the transconductor amplifier and the transresistance stage yields a combination circuit having an extremely fast response. The transresistance stage has a small phase margin causing an overshoot to accelerate the switching speed at the output node 72.

Figure 9A:
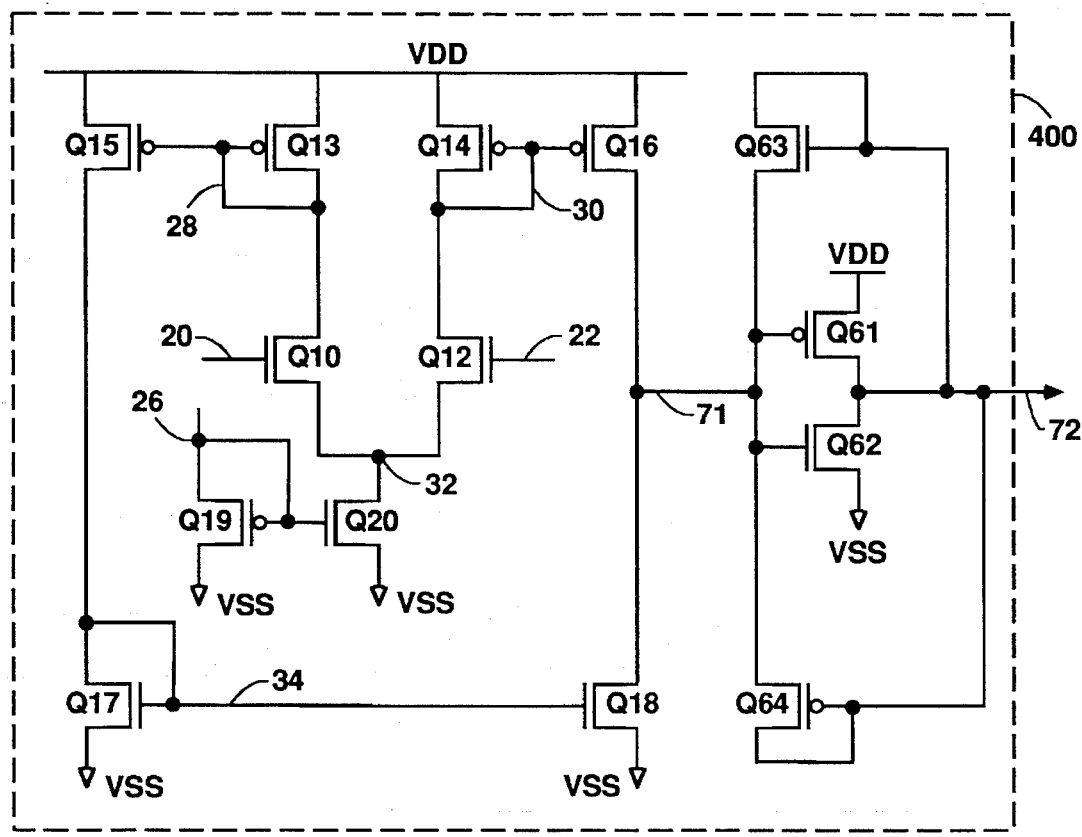
FIG. 9A shows another high speed static comparator comprising a transresistance stage with transistors configured as diodes.

In another embodiment of the high speed static comparator 400, the drain of the transistor Q63 is coupled to the output node 72 rather than the VDD node (see FIG. 9A). Also, the drain of the transistor Q64 is coupled to the output node 72 rather than the VSS node (see FIG. 9A). Such a configuration increases the amount of capacitance that the CMOS inverter (transistors Q61 and Q62) drives, and decreases the power consumption of the high speed static comparator 400. In such a configuration, the transistors Q63 and Q64 may be referred to as shunt diodes.

In another embodiment of the high speed static comparator 400, the voltage at the feedback node 71 need only be clamped in one direction. For example, the transistor Q63 clamps the feedback node 71 and the transistor Q64 is omitted. Alternatively, the transistor Q64 clamps the feedback node 71 and the transistor Q63 is omitted.

Figure 8:
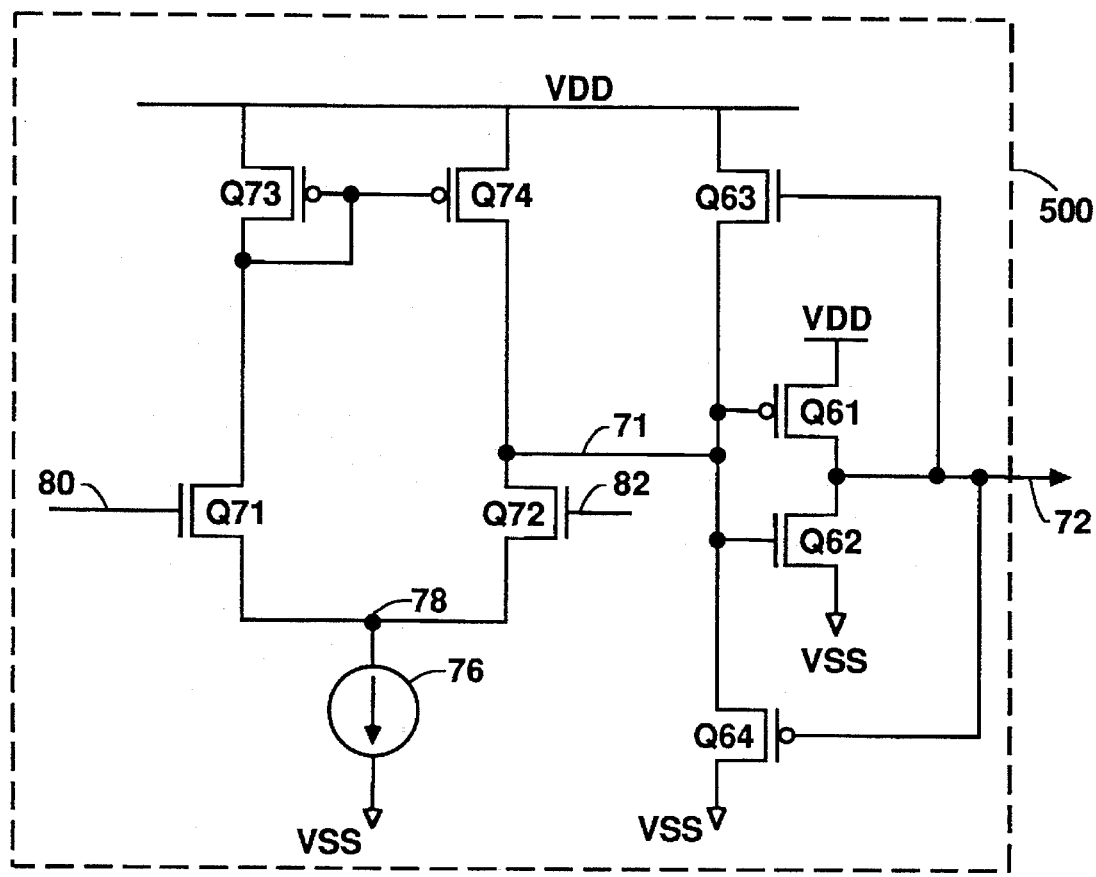
FIG. 8 illustrates another high speed static comparator that employs a transresistance stage.

FIG. 8 illustrates a high speed static comparator 500. The high speed static comparator 500 comprises a transconductance amplifier coupled to a transresistance stage. The transconductance amplifier senses input voltages at an input node 80 and an input node 82, an generates a current at the feedback node 71 into the transresistance stage. The transresistance stage senses the current into the feedback node 71, and generates an output voltage at the output node 72 that indicates which of the input voltages at the input node 80 and 82 has a greater magnitude.

The voltage generated by the transconductance amplifier at the feedback node 71 is clamped by the transresistance stage. The gate width-to-length ratios of the CMOS inverter transistors Q61 and Q62 are adjusted to set the CMOS inverter switching threshold near the center of the common mode output range of the differential amplifier (transistors Q1 and Q2).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A comparator circuit, comprising:

a transconductance stage for sensing a first input voltage on a first input node and a second input voltage on a second input node, the transconductance stage generating a first current into a feedback node, the first current indicating whether the first or the second input voltage has a greater magnitude, the transconductance stage further comprising a differential input transistor pair comprising a first input transistor for sensing the first input voltage and a second input transistor for sensing the second input voltage, the first and second input transistors being metal oxide semiconductor field effect transistors, the differential input transistor pair biased by a bias current circuit:

a diode load/current mirror circuit coupled between the differential input transistor pair and the feedback node, the diode load/current mirror circuit generating the first current according to a difference between a current flowing through the first input transistor and a current flowing through the second input transistor, wherein the diode load/current mirror circuit comprises a first load transistor having a drain and a gate coupled to a drain of the first input transistor at a first node, the first load transistor having a source coupled to a supply voltage;

a second load transistor having a drain and a gate coupled to a drain of the second input transistor at a second node, the second load transistor having a source coupled to the supply voltage;

a first inverter transistor having a gate coupled to the first node, a drain coupled to a third node, and a source coupled to the supply voltage;

a second inverter transistor having a gate coupled to the second node, a drain coupled to the feedback node, and a source coupled to the supply voltage;

a first current mirror transistor having a drain and a gate coupled to the third node, and a source coupled to a common node;

a second current mirror transistor having a gate coupled to the third node, a drain coupled to the feedback node, and a source coupled to the common node;

a transresistance stage coupled to the feedback node, the transresistance stage sensing the first current while providing negative feedback that limits a voltage swing at the feedback node, the transresistance stage generating an output voltage at an output node that indicates whether the first or the second input voltage has a greater magnitude.

2. A comparator circuit, comprising:

a transconductance stage for sensing a first input voltage on a first input node and a second input voltage on a second input node, the transconductance stage generating a first current into a feedback node, the first current indicating whether the first or the second input voltage has a greater magnitude, the transconductance stage further comprising a differential input transistor pair comprising a first input transistor for sensing the first input voltage and a second input transistor for sensing the second input voltage, the first and second input transistors being bi-polar transistors, the differential input transistor pair biased by a bias current circuit:

a diode load/current mirror circuit coupled between the differential input transistor pair and the feedback node, the diode load/current mirror circuit generating the first current according to a difference between a current flowing through the first input transistor and a current flowing through the second input transistor, wherein the diode load/current mirror circuit comprises a first load transistor having a drain and a gate coupled to a collector of the first input transistor at a first node, the first load transistor having a source coupled to a supply voltage;

a second load transistor having a drain and a gate coupled to a collector of the second input transistor at a second node, the second load transistor having a source coupled to the supply voltage;

a first inverter transistor having a gate coupled to the first node, a drain coupled to a third node, and a source coupled to the supply voltage;

a second inverter transistor having a gate coupled to the second node, a drain coupled to the feedback node, and a source coupled to the supply voltage;

a first current mirror transistor having a drain and a gate coupled to the third node, and a source coupled to a common node;

a second current mirror transistor having a gate coupled to the third node, a drain coupled to the feedback node, and a source coupled to the common node;

a transresistance stage coupled to the feedback node, the transresistance stage sensing the first current while providing negative feedback that limits a voltage swing at the feedback node, the transresistance stage generating an output voltage at an output node that indicates whether the first or the second input voltage has a greater magnitude.

3. A comparator circuit, comprising:

a transconductance stage for sensing a first input voltage on a first input node and a second input voltage on a second input node, the transconductance stage generating a first current into a feedback node, the first current indicating whether the first or the second input voltage has a greater magnitude;

a transresistance stage coupled to the feedback node, the transresistance stage sensing the first current while providing negative feedback that limits a voltage swing at the feedback node, the transresistance stage generating an output voltage at an output node that indicates whether the first or the second input voltage has a greater magnitude, wherein the transresistance stage comprises:

an inverter circuit coupled between the feedback node and the output node;

a first transistor configured to function as a first diode coupled between the feedback node and the output node, the first transistor configured to function as the first diode having a source coupled to the feedback node and having a gate and a drain each coupled to the output node;

a second transistor configured to function as a second diode coupled between the feedback node and the output node, the second transistor configured to function as the second diode having a source coupled to the feedback node and having a gate and a drain each coupled to the output node.

4. The comparator circuit of claim 3, wherein the inverter circuit comprises:

first transistor coupled between the supply voltage and the output node, the first transistor having a gate coupled to the feedback node;

second transistor coupled between the common node and the output node, the second transistor having a gate coupled to the feedback node.

\* \* \* \* \*